(12) United States Patent
Saito et al.

(10) Patent No.: US 8,519,439 B2
(45) Date of Patent: Aug. 27, 2013

(54) NITRIDE SEMICONDUCTOR ELEMENT WITH N-FACE SEMICONDUCTOR CRYSTAL LAYER

(75) Inventors: Wataru Saito, Kanagawa (JP); Hidetoshi Fujimoto, Kanagawa (JP)

(73) Assignee: Kabuhiki Kaisha Toshiba, Tokyo (JP)

( * ) Notice: Subject to any disclaimer, the term of this patent is extended or adjusted under 35 U.S.C. 154(b) by 30 days.

(21) Appl. No.: 13/239,229

(22) Filed: Sep. 21, 2011

(65) Prior Publication Data

US 2012/0187452 A1   Jul. 26, 2012

(30) Foreign Application Priority Data

Jan. 26, 2011   (JP) .................................. 2011-014502

(51) Int. Cl.
*H01L 29/66* (2006.01)
(52) U.S. Cl.
USPC .................................. 257/192; 257/E29.255
(58) Field of Classification Search
USPC .................... 257/190–201, E29.255, E21.409
See application file for complete search history.

(56) References Cited

U.S. PATENT DOCUMENTS

| 6,933,544 | B2 | 8/2005 | Saito et al. | |
|---|---|---|---|---|
| 6,940,090 | B2 * | 9/2005 | Saito et al. | 257/20 |
| 7,005,685 | B2 * | 2/2006 | Sakai et al. | 257/103 |
| 7,271,429 | B2 | 9/2007 | Saito et al. | |
| 7,728,354 | B2 | 6/2010 | Saito et al. | |
| 7,777,305 | B2 * | 8/2010 | Kuroda et al. | 257/624 |
| 7,948,011 | B2 * | 5/2011 | Rajan et al. | 257/194 |
| 2006/0278892 | A1 * | 12/2006 | Harris et al. | 257/194 |
| 2009/0072269 | A1 * | 3/2009 | Suh et al. | 257/136 |
| 2010/0244041 | A1 * | 9/2010 | Oishi et al. | 257/76 |
| 2011/0108885 | A1 * | 5/2011 | Sazawa et al. | 257/192 |
| 2012/0097973 | A1 * | 4/2012 | Shi et al. | 257/76 |

FOREIGN PATENT DOCUMENTS

| JP | 2005-244072 | 9/2005 |
|---|---|---|
| JP | 2009-509343 | 3/2009 |
| WO | WO-03-071607 | 8/2003 |

OTHER PUBLICATIONS

S. Keller, et al., "Properties of N-polar AlGaN/GaN heterostructures and field effect transistors grown by metalorganic chemical vapor deposition", Journal of Applied Physics, vol. 103, Paper No. 033708, 4 pages, 2008.

* cited by examiner

*Primary Examiner* — Matthew W Such
*Assistant Examiner* — Ali Naraghi
(74) *Attorney, Agent, or Firm* — Patterson & Sheridan, LLP (57) ABSTRACT

According to one embodiment, the semiconductor element includes a first semiconductor layer. The first semiconductor layer contains $Al_xGa_{1-x}N$. A top layer of the first semiconductor layer is terminated by nitrogen. The semiconductor element includes a second semiconductor layer containing non-doped or first conductivity-type $Al_yGa_{1-y}N$ formed on the first semiconductor layer. The semiconductor element includes a third semiconductor layer containing $Al_zGa_{1-z}N$ formed on the second semiconductor layer. The semiconductor element includes a first major electrode connected to the third semiconductor layer. The semiconductor element includes a second major electrode connected to the third semiconductor layer. The semiconductor element includes a gate electrode provided on the third semiconductor layer between the first major electrode and the second major electrode.

20 Claims, 5 Drawing Sheets

NITRIDE SEMICONDUCTOR ELEMENT WITH N-FACE SEMICONDUCTOR CRYSTAL LAYER

CROSS-REFERENCE TO RELATED APPLICATIONS

This application is based upon and claims the benefit of priority from the prior Japanese Patent Application No. 2011-014502, filed on Jan. 26, 2011; the entire contents of which are incorporated herein by reference.

FIELD

Embodiments described herein relate generally to a semiconductor element.

BACKGROUND

Power semiconductor elements such as a switching element and a diode, are used in circuits for a switching regulator, an inverter, and the like. Such power semiconductor elements are required to achieve the increase in the breakdown voltage and the decrease in the ON-resistance. Between the element breakdown voltage and the ON-resistance, there is a trade-off relationship determined by the element material. The use of a wide bandgap semiconductor as the switching element material can improve this trade-off.

Among these elements, the examples of an element easy to achieve a low ON-resistance include a hetero junction field effect transistor (HFET) having a gallium aluminum nitride (AlGaN)/gallium nitride (GaN) hetero structure. In the HFET, a high mobility in a hetero interface channel and a high concentration of electrons generated by piezo polarization achieve the decrease in the ON-resistance.

However, in the HFET, in order to generate electrons (two-dimensional electron gas) by piezo polarization, the gate threshold voltage typically becomes negative. Therefore, the HFET becomes normally on. In the power electronics applications, such as the switching regulator, for safety reasons, such as the prevention of rush current at turn-on, the gate threshold voltage is preferably positive. That is, in the power electronics applications, a normally-off operation is indispensable.

In order to make the HFET normally-OFF, there are a method to introduce a p-type GaN layer on the lower side of a gate electrode, a method to introduce a recess gate structure, and a method to introduce an MOS-type channel structure. However, the control of the impurity concentration of the p-type GaN layer and the control of the recess depth require complicated process technologies. Therefore, in the conventional HFET, the gate threshold voltage (Vth) easily varies. Moreover, in the MOS-type channel structure, although the variation of the gate threshold voltage is suppressed, an inversion channel is formed in an MIS gate interface, resulting in the decrease in the mobility and the increase in the ON-resistance.

DETAILED DESCRIPTION

In general, according to one embodiment, a semiconductor element is disclosed. The semiconductor element can include a first semiconductor layer which is formed on a supporting substrate. The first semiconductor layer contains $Al_XGa_{1-X}N$ ($0 \leq X < 1$). A top layer of the first semiconductor layer is terminated by nitrogen. The semiconductor element can include a second semiconductor layer which contains non-doped or first conductivity-type $Al_YGa_{1-Y}N$ ($0 < Y \leq 1$, $X < Y$) formed on the first semiconductor layer. The semiconductor element can include a third semiconductor layer which contains $Al_ZGa_{1-Z}N$ ($0 \leq Z < 1$, $Z < Y$) formed on the second semiconductor layer. The semiconductor element can include a first major electrode which is connected to the third semiconductor layer. The semiconductor element can include a second major electrode which is connected to the third semiconductor layer. The semiconductor element can include a gate electrode which is provided on the third semiconductor layer between the first major electrode and the second major electrode. A thickness of the third semiconductor layer is selectively thin under the gate electrode.

Hereinafter, embodiments will be described with reference to the accompanying drawings. In the drawings shown below, like components are marked with like reference numerals.

First Embodiment

Figure 1A:
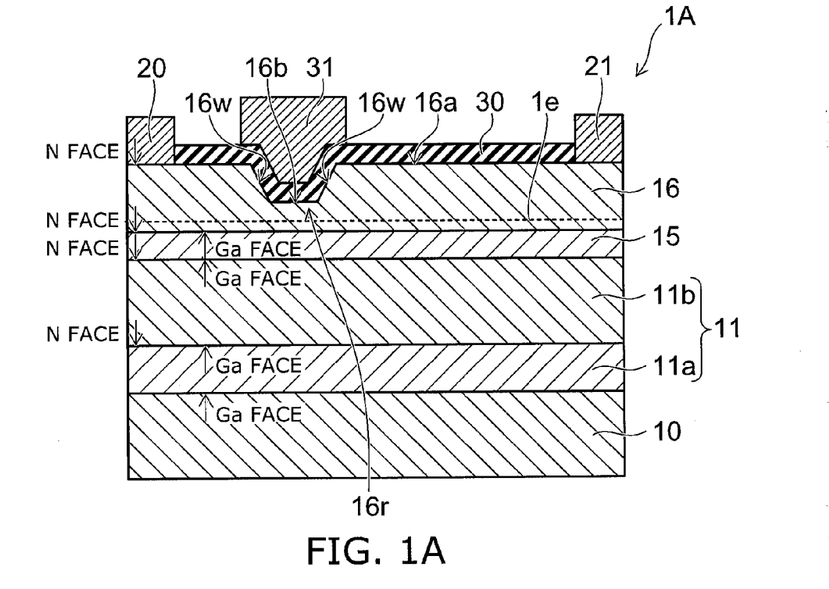
FIG. 1A and FIG. 1B are the schematic views of a nitride semiconductor element according to a first embodiment.
Figure 1B:
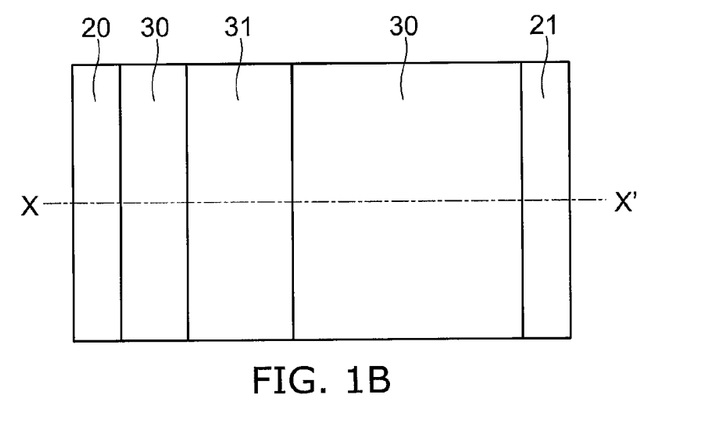

FIG. 1A and FIG. 1B are the schematic views of a nitride semiconductor element according to a first embodiment, wherein FIG. 1A is a cross-sectional schematic view and FIG. 1B is a plan schematic view. In FIG. 1A, there is shown an X-X' cross section of FIG. 1B.

In a nitride semiconductor element 1A, a plurality of semiconductor crystal layers are stacked on a supporting substrate 10. Each semiconductor crystal layer is an N-face (nitrogen face) grown layer. That is, the top face of each semiconductor crystal layer is a face terminated by nitrogen. Each semiconductor crystal layer is formed by epitaxial growth, for example.

The supporting substrate 10 is a silicon carbide (SiC) substrate, for example. A buffer layer 11 is provided on the supporting substrate 10. The buffer layer 11 includes two semiconductor layers, for example. For example, the buffer layer 11 includes an aluminum nitride buffer layer (AlN buffer layer) 11a in contact with the supporting substrate 10, and a gallium nitride buffer layer (GaN buffer layer) 11b provided on the AlN buffer layer 11a. The top face of the AlN buffer layer 11a and the top face of the GaN buffer layer 11b are the faces terminated by the N face. In the embodiment, a semiconductor layer including the buffer layer 11 is referred to as a first semiconductor layer. The composition of the first semiconductor layer is $Al_XGa_{1-X}N$ ($0 \leq X < 1$).

In the nitride semiconductor element 1A, a non-doped or n-type barrier layer 15 is provided on the buffer layer 11. In the specification, the n-type is referred to as a first conductivity type and a p-type is referred to as a second conductivity type, for example. The barrier layer 15 is a gallium aluminum nitride barrier layer (AlGaN barrier layer), for example. The barrier layer 15 is the N-face grown layer. That is, the top face of the barrier layer 15 is a face terminated by the N face. In the embodiment, a semiconductor layer including the barrier layer 15 is referred to as a second semiconductor layer. The composition of the second semiconductor layer is $Al_YGa_{1-Y}N$ ($0<Y\leq1$, $X<Y$).

A non-doped channel layer 16 is provided on the barrier layer 15. The channel layer 16 is a gallium nitride channel layer (GaN channel layer), for example. The channel layer 16 is an N-face grown layer. That is, the top face of the channel layer 16 is a face terminated by the N face. In the embodiment, a semiconductor layer including the channel layer 16 is referred to as a third semiconductor layer. The third semiconductor layer may contain aluminum (Al). The composition of the third semiconductor layer is $Al_ZGa_{1-Z}N$ ($0\leq Z<1$, $Z<Y$). The thickness of the channel layer 16 except a recess part 16r to be described later is approximately 10 times the thickness of the barrier layer 15, for example. The thickness of the barrier layer 15 is 30 nm, for example. However, the ratio between the thickness of the barrier layer 15 and the thickness of the channel layer 16, and the thickness of the barrier layer 15 are not limited to these values.

A source electrode 20 which is a first major electrode is connected to the channel layer 16. A drain electrode 21 which is a second major electrode is connected to the channel layer 16. A gate insulating film 30 is provided on the channel layer 16. Between the source electrode 20 and the drain electrode 21, a gate electrode 31 is provided via the gate insulating film 30. That is, the gate insulating film 30 is provided between the gate electrode 31 and the channel layer 16. The source electrode 20, the drain electrode 21, and the gate electrode 31 extend in a stripe shape seen from the direction perpendicular to the major surface of the supporting substrate 10.

As the quality of the material of the gate electrode 31, a material with a small work function is selected. For example, platinum (Pt), palladium (Pd), or the like is selected as the quality of the material of the gate electrode 31. However, the quality of the material of the gate electrode 31 is not limited to these materials.

In the nitride semiconductor element 1A, the thickness of the channel layer 16 is selectively thin under the gate electrode 31. For example, the channel layer 16 under the gate electrode 31 is dug down to the barrier layer 15 side. That is, the recess part 16r is provided in the channel layer 16 under the gate electrode 31. The recess part 16r includes a bottom face 16b lower from the top face 16a of the channel layer 16 and a tapered side face 16w. The gate electrode 31 further extends from the top face 16a of the channel layer 16 to the bottom face 16b side of the recess part 16r. The gate oxide film 30 is interposed between the bottom face 16b as well as the side face 16w and the gate electrode 31.

Each semiconductor crystal layer of the nitride semiconductor element 1A is formed by a growth process which exposes the N face for the top face side of each semiconductor crystal layer. Therefore, an electron 1e is generated in a hetero interface between the barrier layer 15 and the channel layer 16 by piezo polarization, not in a hetero interface between the buffer layer 11 and the barrier layer 15. For example, a hetero interface channel is generated on the gate insulating film 30 side. Such a structure reduces the process variation and achieves a low ON-resistance, in the nitride semiconductor element 1A, thereby realizing a normally-off operation.

Figure 2:
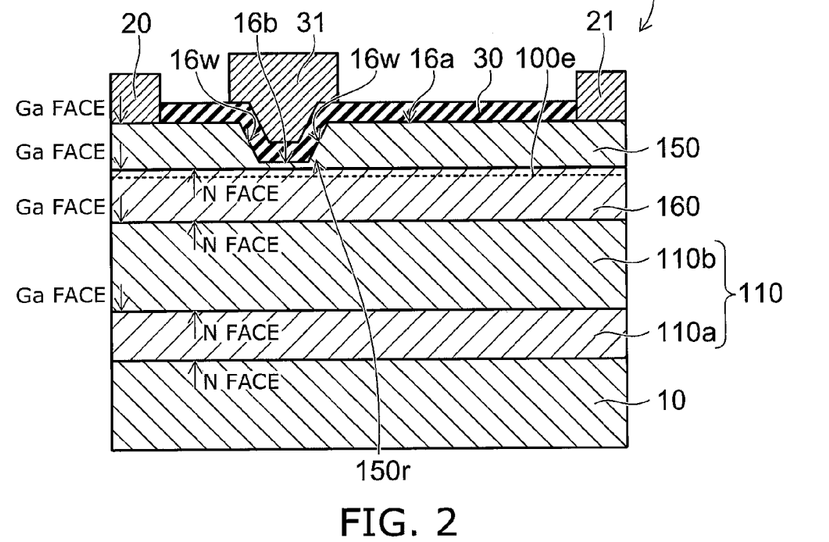
FIG. 2 is a cross-sectional schematic view of the nitride semiconductor element according to the reference example.

Here, for comparison, a nitride semiconductor element 100 as a reference example is shown in FIG. 2.

FIG. 2 is a cross-sectional schematic view of the nitride semiconductor element according to the reference example.

In the nitride semiconductor element 100 shown in FIG. 2, a buffer layer 110 is provided on the supporting substrate 10. For example, an aluminum nitride buffer layer 110a is provided on the supporting substrate 10. On the aluminum nitride buffer layer 110a, a gallium nitride buffer layer 110b is provided.

The top face of the AlN buffer layer 110a and the top face of the GaN buffer layer 110b are the faces terminated by a gallium (Ga). On the buffer layer 11, a non-doped channel layer (GaN channel layer) 160 is provided. On the channel layer 160, a non-doped or n-type barrier layer (AlGaN barrier layer) 150 is provided. The thickness of the barrier layer 150 is approximately one-tenth the thickness of the channel layer 160. For example, the thickness of the barrier layer 150 in which a recess part 150r is not provided is 30 nm. The top face of the barrier layer 150 and the top face of the channel layer 160 are the faces terminated by a gallium. That is, each semiconductor crystal layer of the nitride semiconductor element 100 is formed by a growth process which exposes the gallium face for the top face side of each semiconductor crystal layer on the supporting substrate 10.

In the nitride semiconductor element 100, an electron 100e is generated in a hetero interface between the barrier layer 150 and the channel layer 160 by piezo polarization. A hetero interface channel is formed on the buffer layer 110 side. In the nitride semiconductor element 100, a method to thin the barrier layer 150 is employed in order to realize the normally-off operation. For example, the recess part 150r is provided in the barrier layer 150 under the gate electrode 31.

However, the thickness of the barrier layer 150 is thin as compared with that of the channel layer 160, and therefore a technique of further thinning the barrier layer 150, which is originally thin, becomes complicated. For example, the thickness of the barrier layer 150 of the bottom of the recess part 150r needs to be adjusted to the order of several nanometers (e.g., approximately 5 nm).

Moreover, in the nitride semiconductor element 100, if a high voltage is applied between the source electrode 20 and the drain electrode 21 in an OFF-state, the electron 100e in the hetero interface channel may be trapped in an interface (passivation interface) between the gate oxide film 30 and the barrier layer 150.

For example, if a high voltage is applied between the source electrode 20 and the drain electrode 21 in an OFF-state, electric field concentration occurs at an edge of the gate electrode 31. The electron accelerated by a high electric field jumps into the gate oxide film 30 serving as a passivation film via the barrier layer 150, and may be trapped into an interface between the gate oxide film 30 and the barrier layer 150. Once an electron is trapped in the passivation interface, the electron is difficult to be released even when the nitride semiconductor element 100 becomes in an ON-state or even when the applied voltage drops. Accordingly, the trapped electron may partially deplete the hetero interface channel, resulting in the increase in the ON-resistance (resulting in current collapse phenomena).

Moreover, a defect may occur in the gate oxide film 30 because the electron accelerated by a high electric field jumps into the gate oxide film 30 in the nitride semiconductor element 100. Thereby, the characteristics may change and the reliability may deteriorate in the nitride semiconductor element 100.

Moreover, as an alternative method to realize the normally-off operation, there is a method to form a p-type GaN layer on the barrier layer 150 under the gate electrode 31. However, the process of controlling the impurity concentration of the p-type GaN layer becomes complicated.

In contrast, each semiconductor crystal layer is an N-face grown layer in the nitride semiconductor element 1A shown in FIG. 1. Therefore, the electron 1e is generated in the hetero interface between the barrier layer 15 and the channel layer 16 by piezo polarization. Furthermore, in order to deplete the lower part of the gate electrode 31 in the OFF-state, the channel layer 16 under the gate electrode 31 is selectively thinned and a material with a small work function is used as the gate electrode 31.

For example, by selectively thinning the channel layer 16 under the gate electrode 31, the piezo polarization under the gate electrode 31 is selectively suppressed and the concentration of electrons in the hetero interface channel under the gate electrode 31 selectively decreases. The thickness of the channel layer 16 is larger than the thickness of the barrier layer 15. Therefore, the strictness of the control of the etching depth is not required in forming the recess part 16r. Furthermore, by changing the quality of the material of the gate electrode 31 to the quality of a material with a small work function, a flat band voltage, generated by a difference in the work function between the gate electrode 31 and the channel layer 16, allows the lower part of the gate electrode 31 to be depleted more easily in an OFF-state. Thus, in the nitride semiconductor element 1A, the normally-OFF operation can be realized.

Furthermore, the above-described process of forming the p-type GaN layer is not required in the nitride semiconductor element 1A. That is, the complicated process of controlling the impurity concentration of the p-type GaN layer becomes unnecessary.

Therefore, in the nitride semiconductor element 1A, the variation in the gate threshold voltage (Vth) decreases.

Moreover, the structure of the nitride semiconductor element 1A is not the MOS-type channel structure. As examples of the HFET of a hybrid type structure having an MOS-type channel, there is an HFET that the AlGaN barrier layer is removed only from the gate portion to form the MOS channel structure, and the AlGaN barrier layer is formed in offset regions (between the gate electrode and the source electrodes, and between the gate electrode and the drain electrodes). In the HFET of this MOS-type channel structure, a current is provided between the source electrode and the drain electrode through an inversion channel formed under the gate electrode.

In contrast, the nitride semiconductor element 1A according to the embodiment does not form the inversion channel in the ON-state. That is, in the nitride semiconductor element 1A, the inversion channel is not formed under the gate electrode 31, but a hetero interface channel is formed. Therefore, in the nitride semiconductor element 1A, the channel mobility is high, resulting in a low ON-resistance.

Moreover, in the nitride semiconductor element 1A, the thickness of the channel layer 16 is thicker than the thickness of the barrier layer 15. Therefore, the gate insulating film 30 and the hetero interface are spatially separated from each other by the channel layer 16. Accordingly, in the nitride semiconductor element 1A, the above-described current collapse is suppressed, and thus the increase in the ON-resistance and the deterioration of the reliability are difficult to occur.

As described above, the nitride semiconductor element 1A has the normally-OFF operation with a low ON-resistance and has a high reliability.

Next, variants of the nitride semiconductor element 1A will be described. Each semiconductor crystal layer of the nitride semiconductor element described below is an N-face grown layer.

(First Variant of the First Embodiment)

Figure 3:
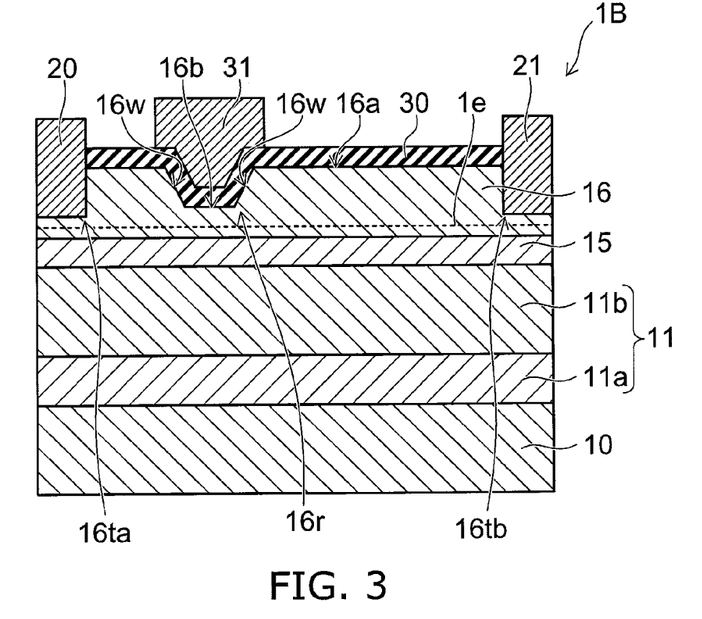
FIG. 3 is a cross-sectional schematic view of a nitride semiconductor element according to a first variant of the first embodiment.

FIG. 3 is a cross-sectional schematic view of a nitride semiconductor element according to a first variant of the first embodiment. In a nitride semiconductor element 1B, the thickness of the channel layer 16 is selectively thin under the source electrode 20 and under the drain electrode 21. That is, a trench 16ta is provided in the channel layer 16 under the source electrode 20. In the trench 16ta, the source electrode 20 is provided. In the nitride semiconductor element 1B, a trench 16tb is provided in the channel layer 16 under the drain electrode 21. In the trench 16tb, the drain electrode 21 is provided. That is, the source electrode 20 and the drain electrode 21 form a trench contact with respect to the channel layer 16, respectively.

Thereby, a spatial distance from the respective source electrode 20 and drain electrode 21 to the channel layer 16 is shortened. As a result, an ohmic resistance from the respective source electrode 20 and drain electrode 21 to the channel layer 16 decreases. That is, in the nitride semiconductor element 1B, the ON-resistance further decreases as compared with the nitride semiconductor element 1A.

(Second Variant of the First Embodiment)

Figure 4:
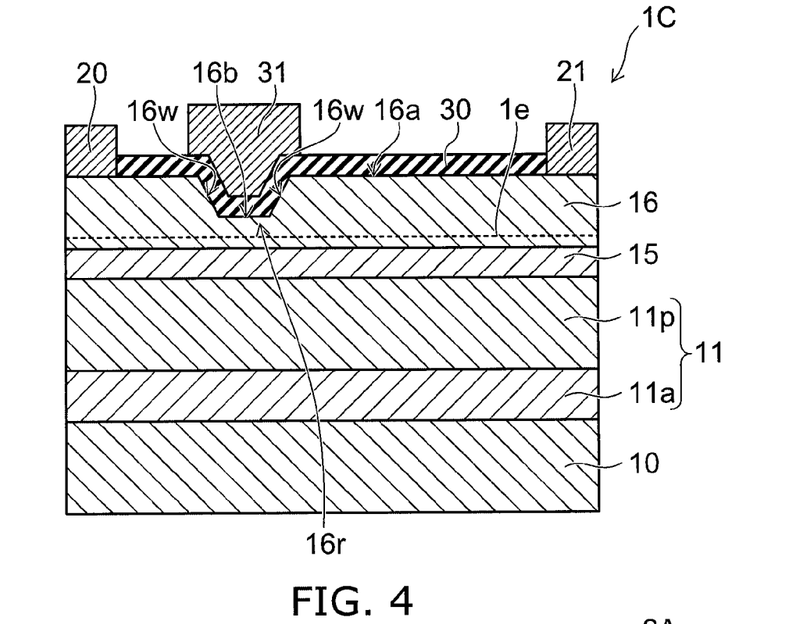
FIG. 4 is a cross-sectional schematic view of a nitride semiconductor element according to a second variant of the first embodiment.

FIG. 4 is a cross-sectional schematic view of a nitride semiconductor element according to a second variant of the first embodiment. In a nitride semiconductor element 1C, the conductivity type of at least a part of the barrier layer 11 which is the first semiconductor layer is a p-type or the resistivity of at least a part of the barrier layer 11 is higher than the resistivity of the channel layer 16.

For example, in the nitride semiconductor element 1C, a p-type buffer layer 11p is provided between the buffer layer 11a and the barrier layer 15. The buffer layer 11p contains $Al_UGa_{1-U}N$ ($0 \leq U \leq 1$).

In the nitride semiconductor element 1C the potential of the buffer layer 11p is raised as compared with the nitride semiconductor element 1A by providing the buffer layer 11p under the barrier layer 15. Thereby, even if a high voltage is applied between the source electrode 20 and the drain electrode 21, an electron is difficult to flow into the buffer layer 11p and thus a leakage current flowing through the buffer layer provided directly under channel layer 16 is suppressed.

Moreover, in the nitride semiconductor element 1C, the p-type buffer layer 11p is provided so as to sandwich the barrier layer 15 with the channel layer 16, and raise the potential of an interface between the barrier layer 15 and the channel layer 16. This further promotes the depletion under the gate electrode 31. That is, in the nitride semiconductor element 1C, the gate threshold voltage shifts further to the positive side as compared with the nitride semiconductor element 1A. As a result, in the nitride semiconductor element 1C, the normally-OFF state can be realized more reliably.

Between the buffer layer 11a and the barrier layers 15, other than providing the p-type buffer layer 11p, the buffer layer 11b may be provided as in the nitride semiconductor element 1A and the buffer layer 11b may be doped with carbon (C), iron (Fe), or the like. Thereby, the resistivity ($\Omega$cm) of the buffer layer 11b becomes higher than the resistivity of the channel layer 16, and even if a high voltage is applied between the source electrode 20 and the drain electrode 21, a leakage current is difficult to flow into the buffer layer 11b. Thus, the high-resistance buffer layer 11b is provided in the nitride semiconductor element 1C.

Second Embodiment

Figure 5:
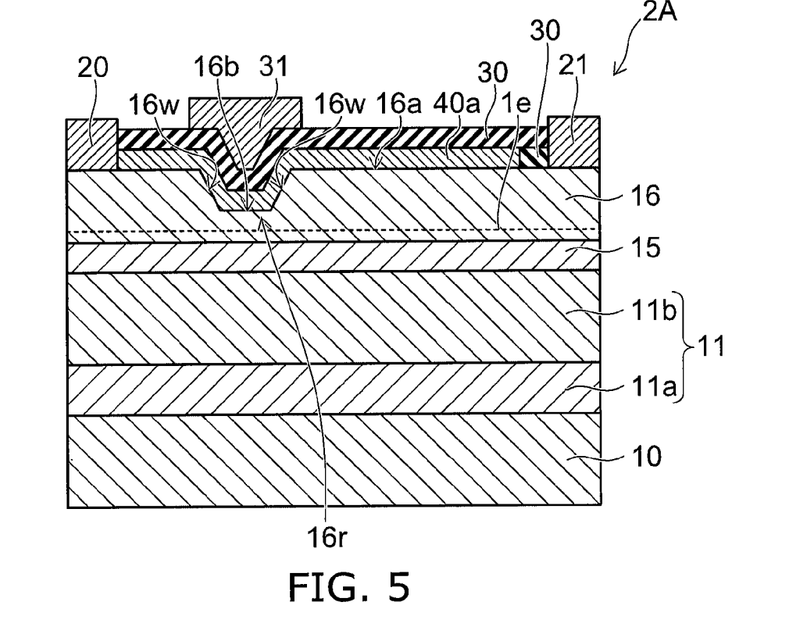
FIG. 5 is a cross-sectional schematic view of a nitride semiconductor element according to a second embodiment.

FIG. 5 is a cross-sectional schematic view of a nitride semiconductor element according to a second embodiment.

In a nitride semiconductor element 2A, a p-type GaN layer 40a is formed on the surface of the channel layer 16. That is, the p-type GaN layer 40a is provided between the channel layer 16 and the gate insulating film 30. The p-type GaN layer 40a is a fourth semiconductor layer containing $Al_UGa_{1-U}N$ ($0 \leq U \leq 1$). Because the p-type GaN layer 40a is provided on the channel layer 16, the potential of the hetero interface channel is raised and the channel under the gate electrode 31 is easy to be depleted. Thereby, in the nitride semiconductor element 2A, the gate threshold voltage shifts further to the positive side as compared with the nitride semiconductor element 1A. As a result, in the nitride semiconductor element 2A, the normally-OFF state can be realized more reliably.

Because the p-type GaN layer 40a is provided on the non-doped channel layer 16, the dopant in the p-type GaN layer 40a is easy to diffuse to the channel layer 16 side. This improves the controllability of the impurity concentration of the p-type GaN layer 40a. Moreover, because the hetero interface of the nitride semiconductor element 2A is non-doped, the channel mobility is high and a low ON-resistance can be maintained.

Moreover, in the nitride semiconductor element 2A, one end of the p-type GaN layer 40a is connected to the source electrode 20. The gate insulating film 30 is provided on the channel layer 16 between the p-type GaN layer 40a and the drain electrode 21. Thereby, a hole generated by avalanche breakdown is promptly discharged to the source electrode 20 via the p-type GaN layer 40a. As a result, the nitride semiconductor element 2A has a high avalanche resistance.

In the nitride semiconductor element 2A, even if a p-type InGaN layer or other p-type semiconductor layer in place of the p-type GaN layer 40a is provided between the channel layer 16 and the gate insulating film 30, the same effect can be obtained. The p-type GaN layer 40a, p-type InGaN layer, and other p-type semiconductor layer may be polycrystalline layers or amorphous layers other than single crystal growth layers. The polycrystalline layer and amorphous layer are formed by reduced-pressure deposition, such as CVD (Chemical Vapor Deposition), for example.

(First Variant of the Second Embodiment)

Figure 6:
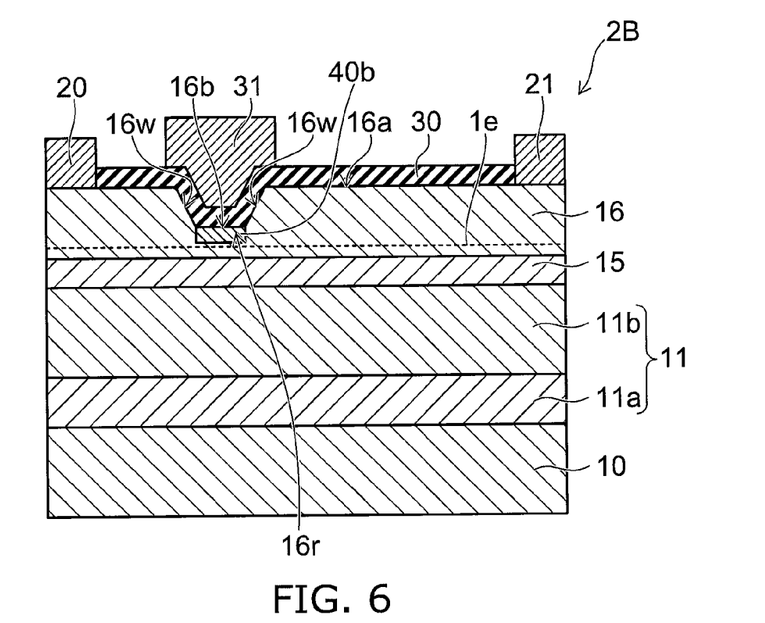
FIG. 6 is a cross-sectional schematic view of a nitride semiconductor element according to a first variant of the second embodiment.

FIG. 6 is a cross-sectional schematic view of a nitride semiconductor element according to a first variant of the second embodiment. In a nitride semiconductor element 2B, a p-type GaN layer 40b is formed in the surface of the channel layer 16. That is, the p-type GaN layer 40b is provided between the channel layer 16 and the gate insulating film 30. The component of the p-type GaN layer 40b is the same as that of the p-type GaN layer 40a. The P-type GaN layer 40b does not cover the whole area of the top face of the channel layer 16. The P-type GaN layer 40b is selectively provided under the gate electrode 31. The p-type GaN layer 40b may be selectively provided in the bottom face 16b of the recess part 16r.

Because the p-type GaN layer 40b is provided on the channel layer 16 under the gate electrode 31, the potential of the hetero interface channel under the gate electrode 31 is raised and the channel under the gate electrode 31 is easy to be depleted. Thereby, in the nitride semiconductor element 2B, the gate threshold voltage shifts further to the positive side as compared with the nitride semiconductor element 1A. As a result, in the nitride semiconductor element 2B, the normally-OFF state can be realized more reliably.

(Second Variant of the Second Embodiment)

Figure 7:
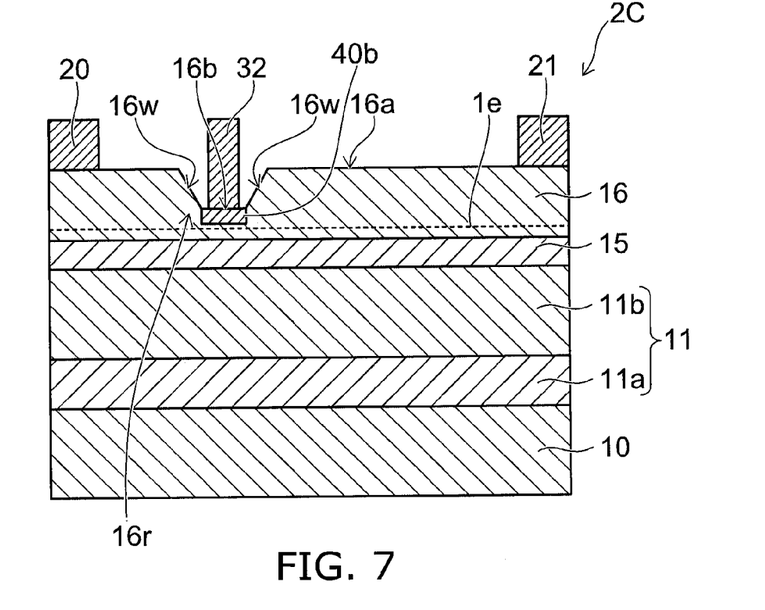
FIG. 7 is a cross sectional schematic view of a nitride semiconductor element according to a second variant of the second embodiment.

FIG. 7 is a cross sectional schematic view of a nitride semiconductor element according to a second variant of the second embodiment.

In a nitride semiconductor element 2C, the above-described gate oxide film 30 is not provided. A P-type GaN layer 40b is formed in the surface of the channel layer 16. That is, in the nitride semiconductor element 2C, the p-type GaN layer 40b is selectively provided in the bottom face 16b of the recess part 16r. The P-type GaN layer 40b does not cover the whole area of the top face of the channel layer 16. Then, the gate electrode 32 is connected to the p-type GaN layer 40b. The gate electrode 32 is not in contact with the channel layer 16.

Because the p-type GaN layer 40b is provided in the surface of the channel layer 16 under the gate electrode 32, the potential of the hetero interface channel under the gate electrode 32 is raised and the channel under the gate electrode 32 is easy to be depleted. Thereby, in the nitride semiconductor element 2C, the gate threshold voltage shifts further to the positive side as compared with the nitride semiconductor element 1A. As a result, in the nitride semiconductor element 2C, the normally-OFF state can be realized more reliably.

Third Embodiment

Figure 8:
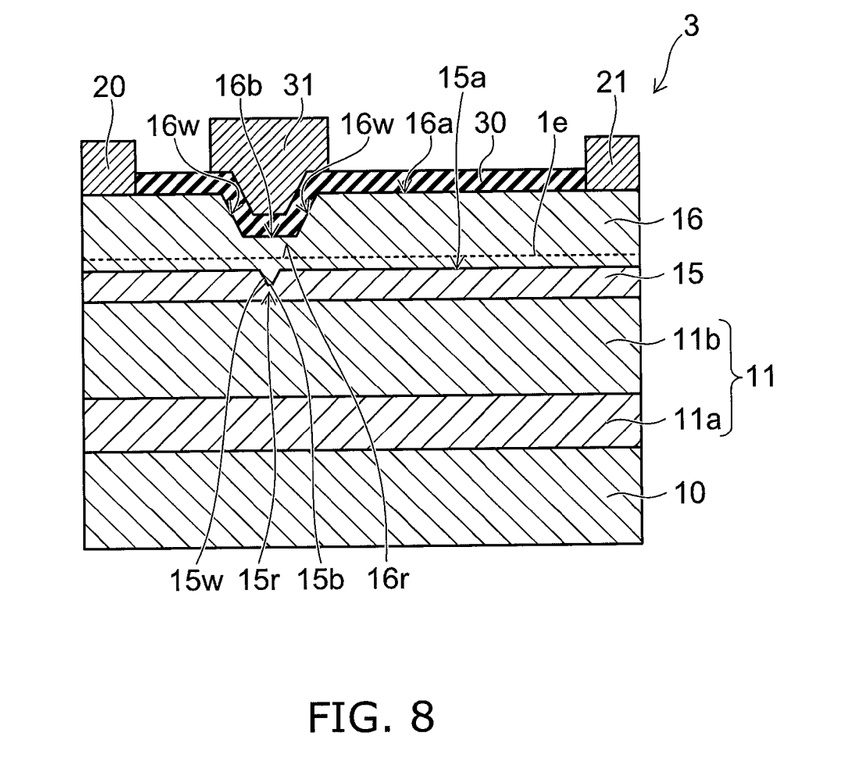
FIG. 8 is a cross-sectional schematic view of a nitride semiconductor element according to a third embodiment.

FIG. 8 is a cross-sectional schematic view of a nitride semiconductor element according to a third embodiment.

In a nitride semiconductor element 3, the thickness of the barrier layer 15 is selectively thin under the gate electrode 31. In the barrier layer 15 under the gate electrode 31, a recess part 15r including a bottom face 15b lower from a top face 15a of the barrier layer 15 and a tapered side face 15w is provided. The channel layer 16 extends inside the recess part 15r.

In the nitride semiconductor element 3, because the thickness of the barrier layer 15 under the gate electrode 31 becomes thin, under the gate electrode 31 the number of electrons generated by piezo polarization decreases. Thereby, in the nitride semiconductor element 3, the gate threshold voltage shifts further to the positive side as compared with the nitride semiconductor element 1A. As a result, in the nitride semiconductor element 3, the normally-OFF state can be realized more reliably.

Hereinabove, the nitride semiconductor elements are described. The embodiments are not limited to the above-described ones, but can be variously modified and implemented without departing from the scope of the embodiments.

For example, a combination of the barrier layer 15/channel layer 16 provided on the supporting substrate 10 may be a GaN layer/InGaN layer, an AlN layer/AlGaN layer, or an InAlN layer/GaN layer.

Moreover, a sapphire substrate, a silicon (Si) substrate, a GaN substrate, or the like other than the SiC substrate may be used as the supporting substrate 10. Regardless of the type of the supporting substrate 10, the embodiments can be implemented by growing an N face whether the supporting substrate 10 is conductive or insulative. Moreover, the supporting substrate 10 may be a substrate for growing each semiconductor crystal layer, or may be a substrate which is bonded to the AlN buffer layer 11a after growing each semiconductor crystal layer.

In the specification, the N-face grown layer of each semiconductor crystal layer can be replaced with the (0, 0, 0, −1)

plane of a GaN crystal. The p-type GaN layer 40b and the source electrode 20 may be connected to each other through an external wiring. Thereby, a hole generated by avalanche breakdown can be promptly discharged to the source electrode 20 via the p-type GaN layer 40b. As a result, the nitride semiconductor element 2B has a high avalanche resistance.

In the specification, the "nitride semiconductor" includes semiconductors with all the compositions expressed by a chemical formula of $B_xIn_yAl_zGa_{1-x-y-z}N$ ($0 \leq x \leq 1$, $0 \leq y \leq 1$, $0 \leq z \leq 1$, $x+y+z \leq 1$), wherein the composition ratio among x, y, and z is varied within the respective ranges. Moreover, a semiconductor further containing a group V element other than N (nitrogen) in the above-described chemical formula, a semiconductor further containing various kinds of elements added to control various physical properties, such as a conductivity type, and a semiconductor further containing various kinds of elements unintentionally contained are also included in the "nitride semiconductor."

Hereinabove, the embodiments of the invention are described with reference to specific examples. However, the invention is not limited to these specific examples. That is, the embodiments contemplated by one skilled in the art suitably adding a design change to these specific examples are also included within the scope of the invention as far as they include the feature of the invention. Each component as well as its arrangement, material, condition, shape, size, and the like of each specific example described above are not necessarily limited to the ones illustrated, and can be suitably changed.

Further, each component of each embodiment described above may be combined within the extent of technical feasibility and are included in the scope of the invention to the extent that the feature of the invention is included.

Other than these, it should be appreciated that within the category of the idea of the invention, one skilled in the art can contemplate various kinds of modifications and variants, and that these modifications and variants are also within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor element, comprising:
    a first semiconductor layer formed on a supporting substrate, the first semiconductor layer containing $Al_xGa_{1-x}N$ ($0 \leq X < 1$), and a top layer of the first semiconductor layer being terminated by nitrogen;
    a second semiconductor layer containing non-doped or first conductivity-type $Al_yGa_{1-y}N$ ($0 < Y \leq 1$, $X < Y$) formed on the first semiconductor layer;
    a third semiconductor layer containing $Al_zGa_{1-z}N$ ($0 \leq Z < 1$, $Z < Y$) formed on the second semiconductor layer;
    a first major electrode connected to the third semiconductor layer;
    a second major electrode connected to the third semiconductor layer;
    a gate electrode provided on the third semiconductor layer between the first major electrode and the second major electrode, the third semiconductor layer having a portion under the gate electrode that is thinner than a portion not under the gate electrode; and
    a fourth semiconductor layer of a second conductivity type provided on the surface of the third semiconductor layer and under the gate electrode, the fourth semiconductor layer contacting the first major electrode but not the second major electrode.

2. The element according to claim 1, further comprising a gate insulating film provided between the gate electrode and the third semiconductor layer.

3. The element according to claim 1, wherein the third semiconductor layer has portions under the first major electrode and the second major electrode that are thinner than a portion not under the first major electrode or the second major electrode.

4. The element according to claim 1, wherein
    a first trench and a second trench are formed in the third semiconductor layer,
    the first major electrode is provided in the first trench, and the second major electrode is provided in the second trench.

5. The element according to claim 1, wherein a conductivity type of at least a part of the first semiconductor layer is a second conductivity type.

6. The element according to claim 1, wherein the first semiconductor layer includes:
    an aluminum nitride buffer layer provided on the supporting substrate and
    a layer containing $Al_UGa_{1-U}N$ ($0 \leq U \leq 1$) provided on the aluminum nitride buffer layer.

7. The element according to claim 1, wherein a resistivity of at least a part of the first semiconductor layer is higher than a resistivity of the third semiconductor layer.

8. The element according to claim 6, wherein a resistivity of the gallium nitride buffer layer is higher than a resistivity of the third semiconductor layer.

9. The element according to claim 1, further comprising a gate insulating film between the gate electrode and the third semiconductor layer, wherein the fourth semiconductor layer is provided between the third semiconductor layer and the gate insulating film.

10. The element according to claim 1, wherein the fourth semiconductor layer contains $Al_UGa_{1-U}N$ ($0 \leq U \leq 1$).

11. The element according to claim 1, wherein the fourth semiconductor layer contains $In_YGa_{1-Y}N$ ($0 \leq Y \leq 1$).

12. The element according to claim 1, wherein the fourth semiconductor layer is a polycrystalline layer or an amorphous layer.

13. The element according to claim 1, wherein a gate insulating film is provided on the third semiconductor layer between the fourth semiconductor layer and the second major electrode.

14. A semiconductor element, comprising:
    a first semiconductor layer formed on a supporting substrate, the first semiconductor layer containing $Al_xGa_{1-x}N$ ($0 \leq X < 1$), and a top layer of first being layer being terminated by nitrogen;
    a second semiconductor layer containing non-doped or first conductivity-type $Al_yGa_{1-y}N$ ($0 < Y \leq 1$, $X < Y$) formed on the first semiconductor layer;
    a third semiconductor layer containing $Al_zGa_{1-z}N$ ($0 \leq Z < 1$, $Z < Y$) formed on the second semiconductor layer;
    a first major electrode connected to the third semiconductor layer;

a second major electrode connected to the third semiconductor layer; and a gate electrode provided on the third semiconductor layer between the first major electrode and the second major electrode, the third semiconductor layer having a portion under the gate electrode that is thinner than a portion not under the gate electrode, and the second semiconductor layer having a portion under the gate electrode that is thinner than a portion not under the gate electrode.

15. The element according to claim 14, wherein a first trench and a second trench are formed in the third semiconductor layer, the first major electrode is provided in the first trench, and the second major electrode is provided in the second trench.

16. The element according to claim 14, further comprising:

a fourth semiconductor layer of a second conductivity type provided on the surface of the third semiconductor layer and under the gate electrode, the fourth semiconductor layer connected to the first major electrode.

17. The element according to claim 14, further comprising:

a fourth semiconductor layer of a second conductivity type provided on the surface of the third semiconductor layer.

18. The element according to claim 17, wherein the fourth semiconductor layer is selectively provided under the gate electrode.

19. The element according to claim 14, wherein the third semiconductor layer has a portion under the first major electrode and the second major electrode that is thinner than a portion not under the first major electrode and the second major electrode.

20. The element according to claim 14, further comprising:

a gate insulating film provided between the gate electrode and the third semiconductor layer.

\* \* \* \* \*

UNITED STATES PATENT AND TRADEMARK OFFICE
CERTIFICATE OF CORRECTION

PATENT NO.       : 8,519,439 B2                                              Page 1 of 1
APPLICATION NO.  : 13/239229
DATED            : August 27, 2013
INVENTOR(S)      : Wataru Saito et al.

It is certified that error appears in the above-identified patent and that said Letters Patent is hereby corrected as shown below:

On the title page [73] "Kabuhiki Kaisha Toshiba" should be replaced with "Kabushiki Kaisha Toshiba".

In the Claim

Column 10, claim 14, line 57, please insert --the-- before "first".

Column 10, claim 14, line 57, please delete "being" and insert --semiconductor--.

Signed and Sealed this
Fourth Day of February, 2014

Michelle K. Lee
*Deputy Director of the United States Patent and Trademark Office*